(12) United States Patent
Wang et al.

(10) Patent No.: US 6,943,096 B1
(45) Date of Patent: Sep. 13, 2005

(54) SEMICONDUCTOR COMPONENT AND METHOD OF MANUFACTURE

(75) Inventors: Connie Pin-Chin Wang, Menlo Park, CA (US); Suzette K. Pangrle, Cupertino, CA (US); Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/665,938

(22) Filed: Sep. 17, 2003

(51) Int. Cl.[7] .......................... H01L 21/20; H01L 21/36
(52) U.S. Cl. ..................................... 438/484; 438/761
(58) Field of Search ................................ 438/388, 484, 438/687, 758, 760, 765, 774, 776, 761

(56) References Cited

U.S. PATENT DOCUMENTS 6,037,258 A * 3/2000 Liu et al. .................... 438/687
6,320,244 B1 * 11/2001 Alers et al. .................. 257/534
6,534,865 B1    3/2003 Lopatin et al.
6,753,249 B1 * 6/2004 Chen et al. .................. 438/637

* cited by examiner

Primary Examiner—Phuc T. Dang
(74) Attorney, Agent, or Firm—Rennie Wm. Dover; Paul Drake

(57) ABSTRACT

A semiconductor component having a metallization system that includes a multi-metal seed layer and a method for manufacturing the semiconductor component. A layer of dielectric material is formed over a lower level interconnect. A hardmask is formed over the dielectric layer and an opening is etched through the hardmask into the dielectric layer. The opening is lined with a thin conformal barrier material. A plurality of metal oxide layers are formed over the conformal barrier material. The plurality of metal oxide layers are reduced by heat treatment to form a multi-metal seed layer. An electrically conductive material is formed over the multi-metal seed layer.

15 Claims, 3 Drawing Sheets

SEMICONDUCTOR COMPONENT AND METHOD OF MANUFACTURE

FIELD OF THE INVENTION

The present invention relates, in general, to a metallization system suitable for use in a semiconductor component and, more particularly, to a metallization system seed layer.

BACKGROUND OF THE INVENTION

Semiconductor component manufacturers are constantly striving to increase the speeds of their components. Because a semiconductor component, such as a microprocessor, contains up to a billion transistors or devices, the focus for increasing speed has been to decrease gate delays of the semiconductor devices that make up the semiconductor component. As a result, the gate delays have been decreased to the point that speed is now primarily limited by the propagation delay of the metallization system used to interconnect the semiconductor devices with each other and with elements external to the semiconductor component. Metallization systems are typically comprised of a plurality of interconnect layers vertically separated from each other by a dielectric material and electrically coupled to each other by metal-filled vias or conductive plugs. Each layer contains metal lines, metal-filled vias, or combinations thereof separated by an insulating material. A figure of merit describing the delay of the metallization system is its Resistance-Capacitance (RC) delay. The RC delay can be derived from the resistance of the metal layer and the associated capacitance within and between different layers of metal in the metallization system. More particularly, the RC delay is given by:

$$RC = (\rho * \epsilon l^2 / (t_m * t_{ox}))$$

where:

ρ is the resistivity of the metallic interconnect layer;

ε is the dielectric constant or permittivity of the dielectric material;

l is the length of the metallic interconnect;

$t_m$ is the thickness of the metal; and $t_{ox}$ is the thickness of the dielectric material.

Thus, the RC delay of the metallization system may be reduced by decreasing the resistivity of the metal comprising the metallization system. Because copper has a lower resistivity than other metals that are compatible with semiconductor processes, semiconductor component manufacturers have begun using metallization systems comprising copper. A drawback with copper is that it is difficult to etch. To mitigate this difficulty, single and dual damascene processes have been developed in which trenches and vias are etched into a dielectric material and then lined with a conformal layer of a barrier material having a uniform thickness. The barrier material prevents diffusion of copper through the sidewalls of the trenches and vias. A single-metal seed layer is formed on the barrier layer and acts as a cathode for electroplating a thick copper layer on the barrier layer. It is desirable for the single-metal seed layer to be a conformal layer having a uniform thickness. However, single-metal seed layers produced using Plasma Vapor Deposition (PVD) have a non-uniform thickness. Thus, the seed layer may be too thin, or absent from portions of the barrier layer, resulting in the formation of voids during the copper electroplating process. Voids increase the resistance of the metallization system. Alternatively, the seed layer may be too thick resulting in pinching or closure of vias lined by the seed layer. Single-metal seed layers produced using Chemical Vapor Deposition (CVD) are formed using halogens which inhibit the seed layer from adhering to the underlying barrier layer. Seed layers formed using Atomic Layer Deposition (ALD) are reduced using a high temperature thermal treatment, which causes the copper atoms in the seed layer to agglomerate. The agglomerated seed layer produces a discontinuous current path during the electroplating step resulting in inadequate copper formation over the seed layer. In addition, agglomeration may expose portions of the barrier layer to oxygen present in the surrounding ambient which oxidizes the exposed portions of the barrier layer. Voids may be formed in the portions of the copper above the oxidized barrier layer.

Accordingly, what is needed is a semiconductor component having a metallization system with a conformal seed layer of uniform thickness and without gaps or discontinuities and a method for manufacturing the semiconductor component.

SUMMARY OF THE INVENTION

The present invention satisfies the foregoing need by providing a semiconductor component and a method for manufacturing the semiconductor component having a multi-metal seed layer. In accordance with one aspect, the present invention includes a method for manufacturing a semiconductor component by forming a dielectric material over a semiconductor substrate. An opening is formed in the dielectric material and lined with a barrier layer. A multi-metal seed layer is formed on the barrier layer. A layer of copper is formed on the multi-metal seed layer.

In accordance with another aspect, the present invention includes an intermediate structure suitable for use in a semiconductor component. The intermediate layer includes a substrate having a dielectric layer disposed thereon. The dielectric layer has an opening that is lined with a barrier material. A precursor seed material comprising at least one metal oxide layer is disposed on the barrier layer.

In accordance with yet another aspect, the present invention comprises a semiconductor component having a dielectric layer with a barrier lined opening. A multi-metal seed layer is disposed on the barrier layer. A metal is disposed over the multi-metal seed layer.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides a semiconductor component including a metallization system having an intermediate structure comprising a plurality of different metal oxide layers, wherein the metal oxide layers are reduced to form a multi-metal seed layer. The multi-metal seed layer is a conformal layer having a uniform thickness and is free of agglomerates. Thus, a void-free low resistance metal layer can be electroplated onto the seed layer. In particular, a low resistance copper layer can be formed on the multi-metal seed layer. The metallization system may be manufactured using, for example, a damascene process, by forming a trench and/or via in a dielectric stack comprising an insulating layer having a hardmask disposed thereon. The trench and/or via is lined with a barrier layer, which barrier layer is lined with the metal oxide layers. The metal oxide layers are reduced to form the multi-metal seed layer. An electrically conductive material is formed over the multi-metal seed layer and planarized (or polished) to form filled trenches and/or vias, e.g., copper-filled trenches when the electrically conductive material is copper.

Figure 1:
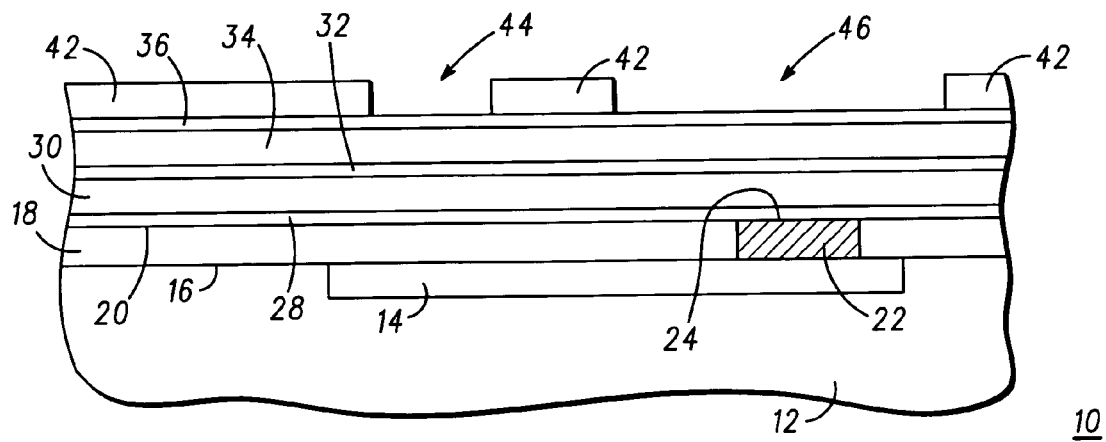
FIG. 1 is a cross-sectional side view of a semiconductor component during manufacture in accordance with an embodiment of the present invention.

FIG. 1 is an enlarged cross-sectional side view of a semiconductor component 10 during an intermediate stage of manufacture in accordance with an embodiment of the present invention. What is shown in FIG. 1 is a portion of a semiconductor substrate 12 in which a semiconductor device 14 has been fabricated. Semiconductor substrate 12 has a major surface 16. It should be understood that semiconductor device 14 has been shown in block form and that the type of semiconductor device is not a limitation of the present invention. Suitable semiconductor devices include active elements such as, for example, insulated gate field effect transistors, complementary insulated gate field effect transistors, junction field effect transistors, bipolar junction transistors, diodes, and the like, as well as passive elements such as, for example, capacitors, resistors, and inductors. Likewise, the material of semiconductor substrate 12 is not a limitation of the present invention. Substrate 12 can be silicon, Silicon-On-Insulator (SOI), Silicon-On-Sapphire (SOS), silicon germanium, germanium, an epitaxial layer of silicon formed on a silicon substrate, or the like. In addition, semiconductor substrate 12 may be comprised of compound semiconductor materials such as gallium-arsenide, indium-phosphide, or the like.

A dielectric material 18 having a major surface 20 is formed on semiconductor substrate 12 and an electrically conductive portion 22 having a surface 24 is formed in a portion of dielectric material 18. By way of example, electrically conductive portion 22 is metal. Metal layer 22 may be referred to as Metal-1, a lower electrically conductive level, a lower metal level, an underlying structure, or an underlying interconnect structure. The combination of dielectric material 18 and electrically conductive portion 22 is referred to as an interconnect layer. When electrically conductive portion 22 is metal, the interconnect layer is also referred to as a metal interconnect layer or a metallic conductive level. Techniques for forming semiconductor devices such as device 14, dielectric material 18, and metal layer 22 are known to those skilled in the art.

An etch stop layer 28 having a thickness ranging between approximately 5 Å and approximately 1,000 Å is formed on surfaces 20 and 24. By way of example, etch stop layer 28 has a thickness of 500 Å. Suitable materials for etch stop layer 28 include dielectric materials such as, for example, silicon oxynitride (SiON), silicon nitride (SiN), silicon rich nitride (SiRN), silicon carbide (SiC), hydrogenated oxidized silicon carbon material (SiCOH), or the like.

A layer of dielectric or insulating material 30 having a thickness ranging between approximately 1,000 Å and approximately 20,000 Å is formed on etch stop layer 28. Preferably, insulating layer 30 has a thickness ranging between 4,000 Å and 12,000 Å. By way of example, insulating layer 30 has a thickness of about 10,000 Å and comprises a material having a dielectric constant ($\kappa$) lower than that of silicon dioxide, silicon nitride, or hydrogenated oxidized silicon carbon material (SiCOH). Although insulating layer 30 can be silicon dioxide, silicon nitride or SiCOH, using materials for insulating layer 30 having a lower dielectric constant than these materials lowers the capacitance of the metallization system and improves the performance of semiconductor component 10. Suitable organic low $\epsilon$ dielectric materials include, but are not limited to, polyimide, spin-on polymers, poly(arylene ether) (PAE), parylene, xerogel, fluorinated aromatic ether (FLARE), fluorinated polyimide (FPI), dense SiLK, porous SiLK (p-SiLK), polytetrafluoroethylene, and benzocyclobutene (BCB). Suitable inorganic low $\kappa$ dielectric materials include, but are not limited to, hydrogen silsesquioxane (HSQ), methyl silsesquioxane (MSQ), fluorinated glass, or NANO-GLASS. It should be understood that the type of dielectric material for insulating layer 30 is not a limitation of the present invention and that other organic and inorganic dielectric materials may be used, especially dielectric materials having a dielectric constant lower than that of silicon dioxide. Similarly, the method of forming insulating layer 30 is not a limitation of the present invention. For example, insulating layer 30 may be formed using spin-on coating, spray-on coating, Chemical Vapor Deposition (CVD), Plasma Enhanced Chemical Vapor Deposition (PECVD), or Plasma Vapor Deposition (PVD), among other techniques.

An etch stop layer 32 having a thickness ranging between approximately 5 Å and approximately 1,000 Å is formed on insulating layer 30. By way of example, etch stop layer 32 has a thickness of 500 Å. Suitable materials for etch stop layer 32 include dielectric materials such as, for example, silicon oxynitride (SiON), silicon nitride (SiN), silicon rich nitride (SiRN), silicon carbide (SiC), hydrogenated oxidized silicon carbon material (SiCOH), or the like. It should be noted that etch stop layer 32 is an optional layer. In other words, etch stop layer 32 may be absent from semiconductor component 10.

A layer of dielectric material 34 having a thickness ranging from approximately 2,000 Å to approximately 20,000 Å is formed on etch stop layer 32. Suitable materials and deposition techniques for dielectric layer 34 are the same as those listed for insulating layer 30. Although the material of dielectric layer 34 may be the same as that of insulating layer 30, preferably the dielectric material is different. In addition, it is preferable that the materials of dielectric layer 34 and insulating layer 30 have different etch rates, yet have similar coefficients of thermal expansion and be capable of withstanding the stress levels brought about during processing and use as a final product.

In accordance with one embodiment, the dielectric material of insulating layer 30 is p-SILK and the material of dielectric layer 34 is silicon oxynitride (SiON). Other suitable materials for dielectric layer 34 include silicon carbide and Ensemble (Ensemble is an interlayer dielectric coating sold by The Dow Chemical Co.). These materials can be applied using a spin-on coating technique and they have similar stress level tolerances and processing temperature tolerances. Moreover, these materials can be selectively or differentially etched with respect to each other. In other words, etchants are available that selectively etch the p-SILK and silicon oxynitride, i.e., an etchant can be used to etch the p-SILK but not significantly etch the silicon oxynitride and another etchant can be used to etch the silicon oxynitride but not significantly etch the p-SILK.

In accordance with another embodiment, the dielectric material of insulating layer 30 is foamed polyimide and the dielectric material of dielectric layer 34 is HSQ. Layers 30, 32, and 34 cooperate to form an insulating structure. Although these embodiments illustrate the use of a combination of organic and inorganic dielectric materials, this is not a limitation of the present invention. The dielectric materials of insulating layer 30 and dielectric layer 34 can both be an organic material, an inorganic material, or a combination of organic and inorganic materials.

Still referring to FIG. 1, a hardmask 36 having a thickness ranging between approximately 100 Å and approximately 5,000 Å is formed on dielectric layer 34. Preferably, hardmask 36 has a thickness ranging between approximately 500 Å and approximately 1,000 Å and comprises a single layer of a dielectric material such as, for example, silicon oxynitride (SiON), silicon nitride (SiN), silicon rich nitride (SiRN), silicon carbide (SiC), or hydrogenated oxidized silicon carbon material (SiCOH). It should be noted that hardmask 36 is not limited to being a single layer system, but can also be a multi-layer system. Hardmask 36 should comprise a material having a different etch rate or selectivity and a different thickness than etch stop layers 28 and 32. Because hardmask 36 lowers the reflection of light during the photolithographic steps used in patterning a photoresist layer 42, it is also referred to as an Anti-Reflective Coating (ARC) layer.

Layer of photoresist 42 is formed on hardmask 36 and patterned to form openings 44 and 46 using techniques known to those skilled in the art.

Figure 2:
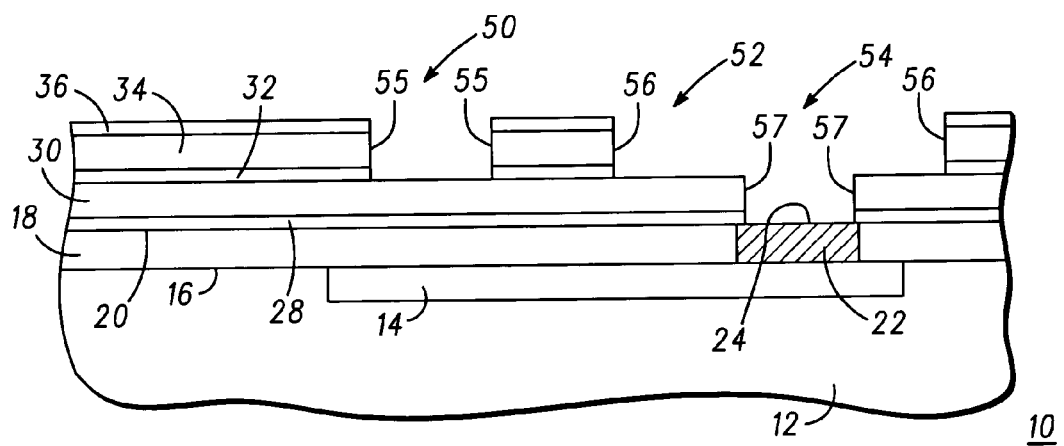
FIG. 2 is a cross-sectional side view of the semiconductor component of FIG. 1 further along in processing.

Referring now to FIG. 2, the portions of hardmask 36 and dielectric layer 34 that are not protected by patterned photoresist layer 42, i.e., the portions exposed by openings 44 and 46, are etched using an anisotropic reactive ion etch to form openings 50 and 52 having sidewalls 55 and 56, respectively. The anisotropic etch stops or terminates in or on etch stop layer 32. In other words, the portions of hardmask 36 and dielectric layer 34 underlying or exposed by openings 44 and 46 are removed using the anisotropic reactive ion etch, thereby exposing portions of etch stop layer 32. Photoresist layer 42 is removed using techniques known to those skilled in the art.

Another layer of photoresist (not shown) is formed on the remaining portions of hardmask 36 and fills openings 50 and 52. The photoresist layer is patterned to form an opening (not shown) that exposes a portion of etch stop layer 32 underlying photoresist-filled opening 52. The exposed portion of etch stop layer 32 and the portion of insulating layer 30 underlying the exposed portion of etch stop layer 32 are etched using a reactive ion etch to form an inner opening 54 having sidewalls 57 that exposes a portion of etch stop layer 28. Thus, the reactive ion etch stops on etch stop layer 28, thereby exposing portions of etch stop layer 28. The photoresist layer is removed.

The exposed portions of etch stop layers 28 and 32 are etched using a reactive ion etch to expose portions of insulating layer 30 and metal layer 22. Preferably, the photoresist layer is removed prior to exposing insulating layer 30 because low $\epsilon$ dielectric materials that may comprise insulating layer 30 are sensitive to photoresist removal processes and may be damaged by them.

Opening 50 in combination with layers 30, 32, 34, and 36 form a single damascene structure, whereas openings 52 and 54 in combination with layers 28, 30, 32, 34, and 36 form a dual damascene structure. When an opening such as opening 50 is used to electrically couple vertically spaced apart interconnect layers it is typically referred to as a via or an interconnect via, whereas when an opening such as opening 52 is used to horizontally route electrically conductive lines or interconnects it is typically referred to as a trench or an interconnect trench.

Figure 3:
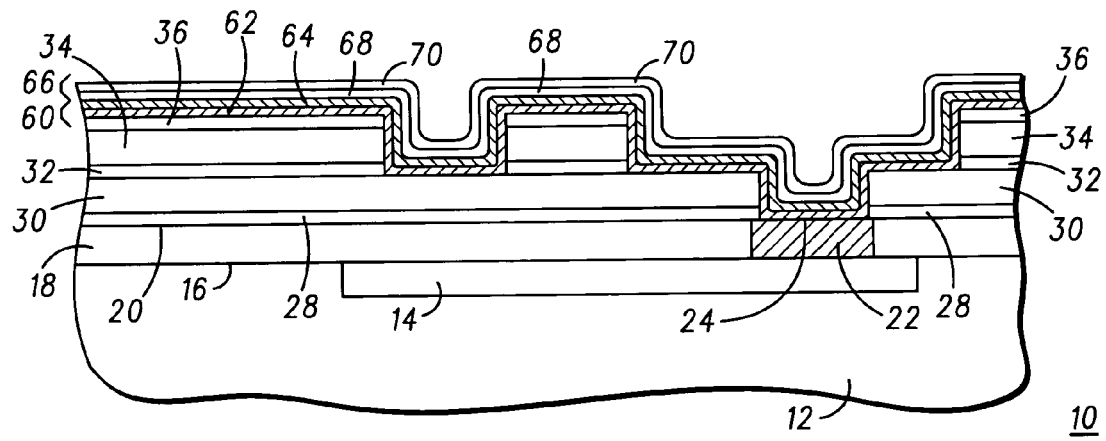
FIG. 3 is a cross-sectional side view of the semiconductor component of FIG. 2 further along in processing.

Referring now to FIG. 3, a barrier 60 having a thickness ranging between approximately 5 Å and approximately 65 Å is formed on hardmask 36 and in openings 50, 52, and 54 (shown in FIG. 2). Barrier 60 is a multi-layer structure comprising a conformal protective layer 62 and a conformal capping layer 64. In other words, protective layer 62 cooperates with capping layer 64 to form barrier 60. Protective layer 62 prevents corrosion of conductive layers such as, for example, layer 22, whereas capping layer 64 retards electromigration. Thus, protective layer 62 is also referred to as a corrosion inhibition or retardation layer and capping layer 64 is also referred to as an electromigration resistant or retardation layer.

Protective layer 62 is formed by conformally depositing an electrically conductive material using a non-halide based precursor in an Atomic Layer Deposition (ALD) process. By way of example, the material of protective layer 62 is metal nitride. Suitable metal nitride materials for protective layer 62 include tantalum nitride, tungsten nitride, and titanium nitride. Alternatively, protective layer 62 may be formed using a metal nitride that is doped with carbon or silicon. For example, protective layer 62 can be silicon doped tantalum nitride (TaSiN), carbon doped tantalum nitride (TaCN), silicon doped tungsten nitride (WSiN), carbon doped tungsten nitride (WCN), silicon doped titanium nitride (TiSiN), carbon doped titanium nitride (TiCN), or the like. An advantage of using atomic layer deposition is that it is capable of producing a highly densified thin, conformal layer or film using a non-halide based precursor such as, for example, an organometallic precursor. Examples of suitable organometallic precursors include, among others, pentakis (diethylamido)tantalum (PDEAT), t-butylimino tris(diethylamino)tantalum (TBTDET), ethylimino tris(diethylamino) tantalum (EITDET -c), pentakis(ethylmethylamido) tantalum (PEMAT), tridimethylaminetitanate (TDMAT), tetrakis(diethlyamino)titanium (TDEAT), (trimethylvinylsilyl)hexafluoroacetylacetonato copper I, or tungsten hexacarbon-monoxide ($W(CO)_6$). The non-halide based precursors do not form by-products such as tantalum pentachloride or tantalum pentafluoride that corrode metals such as copper. Moreover, the conformal layers formed using these precursors are sufficiently dense that they need only be a few angstroms thick, e.g., 3 Å to 10 Å, to cover or protect any underlying metal layers. Because the protective layer can be so thin, interconnect layers comprising a barrier layer and a bulk electrically conductive material, e.g., copper, that are made in accordance with the present invention have a very low resistance. Preferably, protective layer 62 has a thickness ranging between approximately 5 Å and approximately 60 Å.

Capping layer 64 is formed by conformally depositing an electrically conductive material using an ALD process. Suitable materials for capping layer 64 include tantalum, tungsten, titanium, refractory metals, or the like. By way of example, capping layer 64 is a tantalum film formed using the ALD process with a reducing agent, where the tantalum is derived from either tantalum pentachloride ($TaCl_5$) or tantalum pentafluoride ($TaF_5$) and the reducing agent is either a hydrogen ($H_2$) plasma or an ammonia ($NH_3$) plasma. Capping layer 64 has a thickness ranging from approximately 1 Å to approximately 10 Å. Capping layer 64 provides a highly reliable interface with a subsequently deposited metal film such as, for example, copper, and improves electromigration resistance.

Still referring to FIG. 3, an intermediate structure 66 is formed on capping layer 64. In accordance with one embodiment, intermediate structure 66 is a two-layer structure comprising a layer of copper oxide 68 formed on capping layer 64 and a layer of tin oxide 70 formed on copper oxide layer 68. By way of example, copper oxide layer 68 may be formed by reacting copper tetramethylheptanedionate (THD) with ozone using atomic layer deposition and tin oxide layer 70 may be formed by reacting an organometallic comprising tin with nitric oxide using atomic layer deposition. Preferably, copper oxide layer 68 has a thickness ranging from approximately 5 Å to approximately 300 Å and tin oxide layer 70 has a thickness ranging from approximately 1 Å to approximately 30 Å. The intermediate structure is also referred to as a precursor seed material.

Figure 4:
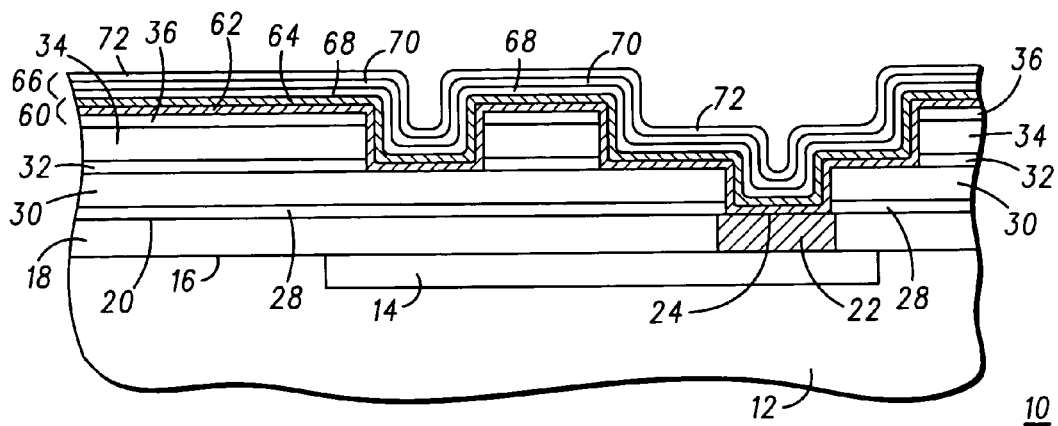
FIG. 4 is a cross-sectional side view of the semiconductor component of FIG. 2, further along in processing in accordance with an alternative embodiment.
Figure 5:
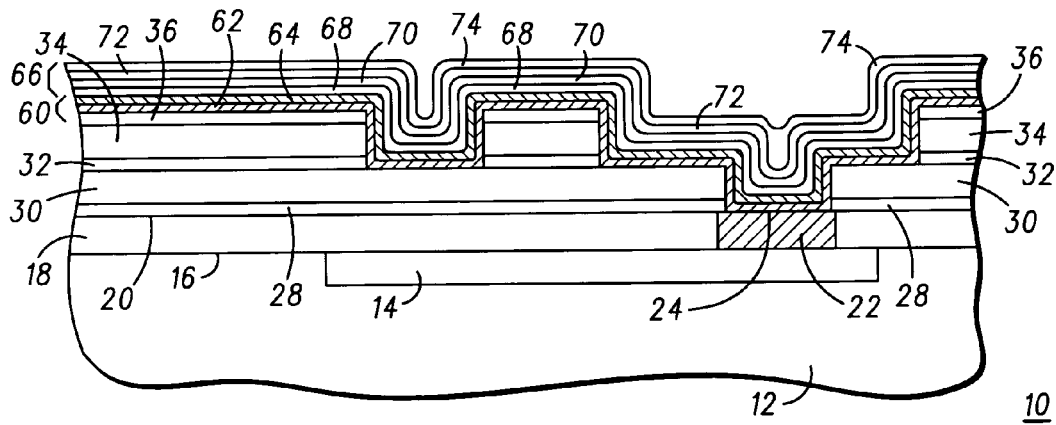
FIG. 5 is a cross-sectional side view of the semiconductor component of FIG. 2, further along in processing in accordance with another alternative embodiment.
Figure 6:
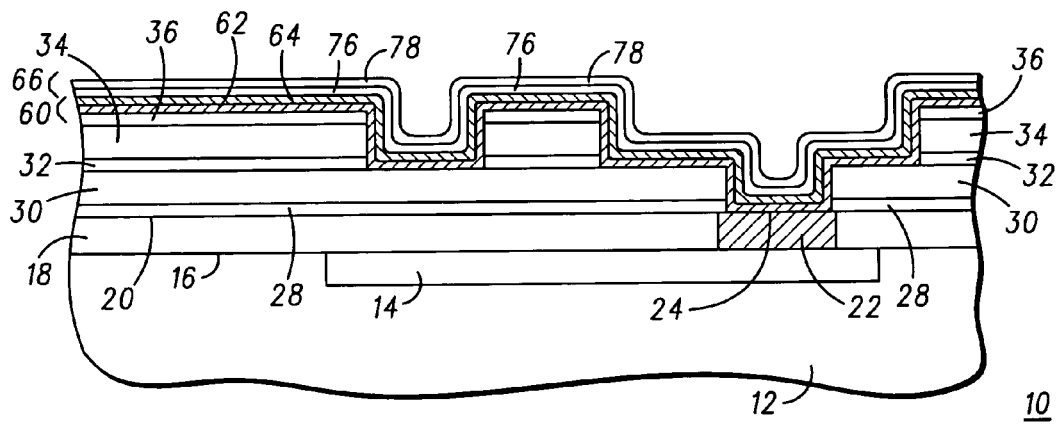
FIG. 6 is a cross-sectional side view of the semiconductor component of FIG. 2, further along in processing in accordance with yet another alternative embodiment.

It should be understood that intermediate structure 66 is not limited to having two metal oxide layers. Thus, FIGS. 4, 5, and 6 illustrate additional embodiments of intermediate structure 66. Briefly referring to FIG. 4, a cross-sectional side view of intermediate structure 66 is illustrated in accordance with another embodiment of the present invention. In accordance with the embodiment of FIG. 4, intermediate structure 66 is a three-layer structure comprising copper oxide layer 68, tin oxide layer 70, and a copper oxide layer 72. Preferably copper oxide layer 72 is formed on tin oxide layer 70 using the technique and thickness range described with reference to the formation of copper oxide layer 68.

Briefly referring to FIG. 5, a cross-sectional side view of an intermediate structure 66 is illustrated in accordance with yet another embodiment of the present invention. In accordance with the embodiment of FIG. 5, intermediate structure 66 is a four-layer structure comprising copper oxide layer 68, tin oxide layer 70, copper oxide layer 72, and a tin oxide layer 74. Preferably tin oxide layer 74 is formed on copper oxide layer 72 using the technique and thickness range described with reference to the formation of tin oxide layer 70.

Briefly referring to FIG. 6, a cross-sectional side view of an intermediate structure 66 is illustrated in accordance with yet another embodiment of the present invention. In accordance with the embodiment of FIG. 6, intermediate structure 66 is a two-layer structure comprising a layer of tin oxide 76 formed on capping layer 64 and a layer of copper oxide 78 formed on tin oxide layer 76. Preferably tin oxide layer 76 is formed using the technique and thickness range described with reference to the formation of tin oxide layer 70 and copper oxide layer 78 is formed using the technique and thickness range described with reference to the formation of copper oxide layer 68.

It should be understood the number of layers of metal oxide, the types of metal oxides, and the process sequence for forming the metal layers is not a limitation of the present invention. For example, intermediate structure 66 may be comprised of more than four layers of metal oxide. Other suitable metal oxides include zinc oxide and silver oxide. Preferably, the metal oxides have similar heats of formation, e.g., the heat of formation of copper oxide is about −43 kilocalories per mole and that of tin oxide is about −67 kilocalories per mole. However, the materials of intermediate structure 66 are not limited by their heats of formation. For example, zinc oxide has a heat of formation of −83 kilocalories per mole and silver oxide has a heat of formation of −7 kilocalories per mole.

Figure 7:
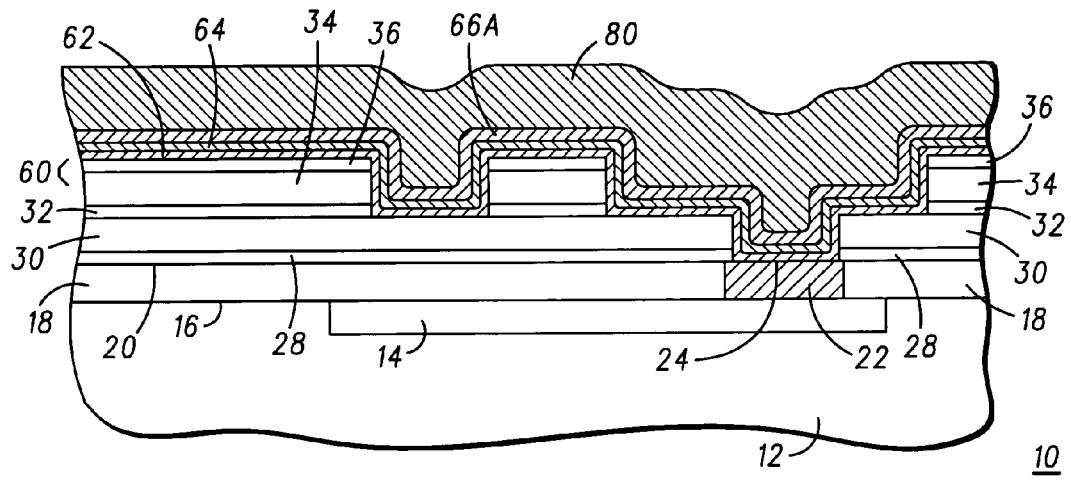
FIG. 7 is a cross-sectional side view of the semiconductor component of FIG. 3 further along in processing.

Referring now to FIG. 7, semiconductor component 10 is heat treated in an ambient comprising a combination of nitrogen, hydrogen, and ammonia to form a multi-metal seed layer 66A. By way of example, the temperature range of the heat treatment is from approximately 150 degrees Celsius (° C.) to approximately 400° C. and the duration of the heat treatment ranges from approximately 30 sec to approximately 60 minutes.

After the heat treatment, the multi-layer intermediate structure becomes a single layer multi-metal seed layer; thus, the letter "A" has been appended to reference number 66. It should be understood the composition of the heat treatment ambient, the temperature range of the heat treatment, and the duration of the heat treatment are not limitations of the present invention. Preferably, the multi-metal seed layer has a thickness of less than approximately 300 Å. Even more preferably, the multi-metal seed layer has a thickness ranging from approximately 50 Å to approximately 200 Å. In an embodiment wherein the multi-metal seed layer includes tin, it is desirable for the tin to have a concentration ranging from approximately 0.1 atomic percent to approximately 10 atomic percent.

A film or layer 80 of an electrically conductive material is formed on multi-metal seed layer 66A and fills openings 50, 52, and 54, thereby forming a metal-filled barrier-lined opening. By way of example layer 80 is copper which is plated on multi-metal seed layer 66A. Techniques for plating copper on a seed layer are known to those skilled in the art. Alternatively, layer 80 may be aluminum or silver.

Figure 8:
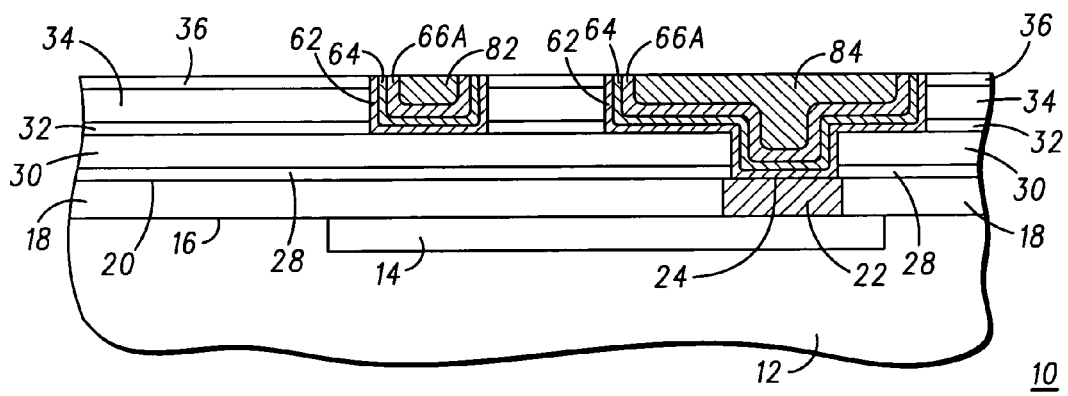
FIG. 8 is a cross-sectional side view of the semiconductor component of FIG. 7 further along in processing.

Referring now to FIG. 8, copper layer 80 is planarized using, for example, a Chemical Mechanical Polishing (CMP) technique having a high selectivity to hardmask 36. Thus, the planarization stops on hardmask 36. After planarization, portion 82 of copper film 80 remains in opening 50 and portion 84 of copper film 80 remains in openings 52 and 54, which openings are shown in FIG. 2. As those skilled in the art are aware, Chemical Mechanical Polishing is also referred to as Chemical Mechanical Planarization. The method for planarizing copper film 80 is not a limitation of the present invention. Other suitable planarization techniques include electropolishing, electrochemical polishing, chemical polishing, and chemically enhanced planarization.

Optionally, a passivation or protective layer (not shown) may be formed over portions 80 and 82 and over hardmask 36.

By now it should be appreciated that a semiconductor component having a metallization system comprising a conformal multi-metal seed layer formed on a barrier material has been provided. The conformal multi-metal seed layer is formed from an intermediate structure comprised of a plurality of metal oxide layers formed over the barrier layer. The plurality of metal oxide layers are then reduced to form the multi-metal seed layer. An advantage of using the plurality of metal oxide layers is that a conformal multimetal seed layer of uniform thickness can be formed without agglomeration of the seed layer during the heat treatment step. In addition, the intermediate structure can be formed using atomic layer deposition without the formation of by-products that can corrode other metals such as copper. The method is suitable for integration with semiconductor processing techniques such as single and dual damascene processes. Another advantage of the multi-metal seed layer manufactured in accordance with the present invention is that it is cost effective to implement in semiconductor component manufacturing processes.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor component, comprising:
    providing a semiconductor substrate having a major surface;
    forming a dielectric material over the major surface;
    forming an opening in the dielectric material, the opening having sidewalls;
    lining the opening with a barrier layer; and
    forming a multi-metal seed layer on the barrier layer by:
        forming a first metal oxide layer on the barrier layer;
        forming a second metal oxide layer on the first metal oxide layer; and
        reducing the first and second metal oxide layers.

2. The method of claim 1, wherein reducing the first and second metal oxide layers includes heating the first and second metal oxide layers to a temperature of at least 150 degrees Celsius.

3. A method for manufacturing a semiconductor component, comprising:
    providing a semiconductor substrate having a major surface;
    forming a dielectric material over the major surface;
    forming an opening in the dielectric material, the opening having sidewalls;
    lining the opening with a barrier layer; and
    forming a multi-metal seed layer on the barrier layer by:
        forming a first metal oxide layer on the barrier layer using atomic layer deposition; and
        forming a second metal oxide layer on the first metal oxide layer.

4. The method of claim 3, wherein forming the second metal oxide layer includes using atomic layer deposition to form the second metal oxide layer.

5. The method of claim 1, wherein forming the first metal oxide layer includes using a metal oxide selected from the group of metal oxides consisting of copper oxide, tin oxide, silver oxide, and zinc oxide.

6. The method of claim 1, wherein forming the second metal oxide layer includes using a metal oxide selected from the group of metal oxides consisting of copper oxide, tin oxide, silver oxide, and zinc oxide.

7. A method for manufacturing a semiconductor component, comprising:
    providing a semiconductor substrate having a major surface;
    forming a dielectric material over the major surface;
    forming an opening in the dielectric material, the opening having sidewalls;
    lining the opening with a barrier layer; and
    forming a multi-metal seed layer on the barrier layer by:
        forming a first metal oxide layer on the barrier layer;
        forming a second metal oxide layer on the first metal oxide layer;
        forming a third metal oxide layer on the second metal oxide layer; and
        reducing the first and second metal oxide layers.

8. The method of claim 7, wherein the first metal oxide layer comprises copper oxide, the second metal oxide layer comprises tin oxide layer, and the third metal oxide layer comprises copper oxide.

9. The method of claim 1, further including forming a layer of copper on the multi-metal seed layer.

10. A method for manufacturing a semiconductor component, comprising:
    providing a semiconductor substrate having a major surface;
    forming a dielectric material over the major surface;
    forming an opening in the dielectric material, the opening having sidewalls;
    lining the opening with a barrier layer; and
    forming a multi-metal seed layer on the barrier layer using a metal selected from the group of metals consisting of copper, tin, silver, and zinc.

11. The method of claim 1, wherein forming the multi-metal seed layer includes forming the multi-metal seed layer to have a thickness of less than approximately 300 Angstroms.

12. The method of claim 1, wherein the first metal oxide layer comprises copper oxide, the second metal oxide layer comprises tin oxide layer, and the third metal oxide layer comprises copper oxide.

13. The method of claim 1, wherein forming the second metal oxide layer includes using atomic layer deposition to form the second metal oxide layer.

14. The method of claim 3, wherein forming the first metal oxide layer includes using a metal oxide selected from the group of metal oxides consisting of copper oxide, tin oxide, silver oxide, and zinc oxide.

15. The method of claim 3, wherein forming the second metal oxide layer includes using a metal oxide selected from the group of metal oxides consisting of copper oxide, tin oxide, silver oxide, and zinc oxide.

* * * * *